(12) United States Patent
Van Laanen et al.

(10) Patent No.: US 7,806,574 B2
(45) Date of Patent: Oct. 5, 2010

(54) THERMAL MANAGEMENT OF LED-BASED LIGHTING SYSTEMS

(75) Inventors: Peter Van Laanen, Boulder, CO (US); Jeff Bisberg, Boulder, CO (US)

(73) Assignee: Albeo Technologies, Inc., Boulder, CO (US)

( * ) Notice: Subject to any disclaimer, the term of this patent is extended or adjusted under 35 U.S.C. 154(b) by 446 days.

(21) Appl. No.: 11/735,903

(22) Filed: Apr. 16, 2007

(65) Prior Publication Data

US 2007/0242462 A1    Oct. 18, 2007

Related U.S. Application Data

(60) Provisional application No. 60/744,935, filed on Apr. 16, 2006.

(51) Int. Cl.
*B60Q 1/00* (2006.01)
(52) U.S. Cl. .................. 362/547; 362/800; 362/218; 362/264; 362/294; 362/345
(58) Field of Classification Search ................ 362/800, 362/547, 218, 264, 294, 345, 373, 293
See application file for complete search history.

(56) References Cited

U.S. PATENT DOCUMENTS

| | | | |
|---|---|---|---|
| 4,814,667 A * | 3/1989 | Tanaka ...................... 313/500 |
| 5,113,232 A | 5/1992 | Itoh et al. | |
| 5,278,432 A * | 1/1994 | Ignatius et al. ................ 257/88 |
| 5,785,418 A | 7/1998 | Hochstein | |
| 5,857,767 A | 1/1999 | Hochstein | |
| 6,045,240 A * | 4/2000 | Hochstein ................... 362/294 |
| 6,428,189 B1 | 8/2002 | Hochstein | |
| 6,582,100 B1 | 6/2003 | Hochstein et al. | |
| 6,894,901 B2 | 5/2005 | Simon | |
| 6,966,677 B2 | 11/2005 | Galli | |
| 6,999,318 B2 | 2/2006 | Newby | |

(Continued)

FOREIGN PATENT DOCUMENTS

WO    WO 2005083804    9/2005

(Continued)

OTHER PUBLICATIONS

Bisberg, J. (Albeo Technologies, Inc. president), Sales offer, email dated Jun. 28, 2006, 1 page, unpublished.

*Primary Examiner*—Sandra L O Shea
*Assistant Examiner*—Danielle Allen
(74) *Attorney, Agent, or Firm*—Lathrop & Gage LLP

(57) ABSTRACT

An LED-based lighting system includes a printed circuit board ("PCB") having conductors on a front-side thereof, one or more LEDs mounted with the conductors, and a structural element. The PCB is mounted with the conductors near to the structural element so that heat dissipation from the LEDs is primarily through the conductors and the structural element. A method of dissipating heat generated by an LED-based lighting system includes configuring a PCB with conductors on a front-side of the PCB, such that when one or more LEDs mounted to the conductors generates heat, the heat dissipates from the one or more LEDs to the conductors. The method also includes integrating a structural element such that at least portions of the conductors face the structural element, and the heat dissipates from the conductors to the structural element.

13 Claims, 3 Drawing Sheets

U.S. PATENT DOCUMENTS

| | | | |
|---|---|---|---|
| 7,114,831 B2 | 10/2006 | Popovich et al. |
| 7,196,459 B2 | 3/2007 | Morris |
| 7,201,511 B2 | 4/2007 | Moriyama et al. |
| 7,235,878 B2 | 6/2007 | Owen et al. |
| 7,236,366 B2 | 6/2007 | Chen |
| 7,281,820 B2 | 10/2007 | Bayat et al. |
| 7,344,279 B2 | 3/2008 | Mueller et al. |
| 7,348,604 B2 | 3/2008 | Matheson |
| 7,388,753 B2 | 6/2008 | Liu et al. |
| 7,413,326 B2 | 8/2008 | Tain et al. |
| 2004/0184272 A1 | 9/2004 | Wright et al. |
| 2004/0264141 A1* | 12/2004 | Spryshak ................... 361/719 |
| 2005/0082965 A1 | 4/2005 | Huang et al. |
| 2005/0085011 A1 | 4/2005 | Lee |
| 2005/0157469 A1 | 7/2005 | Gorak |
| 2006/0139932 A1 | 6/2006 | Park |
| 2006/0268527 A1 | 11/2006 | Tanaka et al. |
| 2007/0063342 A1 | 3/2007 | Chen et al. |
| 2007/0081340 A1 | 4/2007 | Chung et al. |
| 2007/0081342 A1 | 4/2007 | Szeto |
| 2007/0121326 A1 | 5/2007 | Nall et al. |
| 2007/0139930 A1 | 6/2007 | Spivak |
| 2007/0189012 A1 | 8/2007 | Huang et al. |
| 2007/0230185 A1 | 10/2007 | Shuy |
| 2007/0236935 A1 | 10/2007 | Wang |
| 2007/0247851 A1 | 10/2007 | Villard |
| 2007/0247853 A1 | 10/2007 | Dorogi |
| 2007/0259160 A1 | 11/2007 | Huang |
| 2007/0268703 A1 | 11/2007 | Gasquet et al. |
| 2007/0285926 A1 | 12/2007 | Maxik |
| 2007/0291490 A1 | 12/2007 | Tajul et al. |
| 2008/0002410 A1 | 1/2008 | Burton et al. |
| 2008/0007954 A1 | 1/2008 | Li |
| 2008/0137308 A1 | 6/2008 | MacDonald et al. |
| 2008/0144291 A1 | 6/2008 | Hu et al. |
| 2008/0158887 A1 | 7/2008 | Zhu et al. |
| 2008/0170371 A1 | 7/2008 | Lai |
| 2008/0174968 A1 | 7/2008 | Feng et al. |
| 2008/0174969 A1 | 7/2008 | Sandwall |
| 2008/0186682 A1 | 8/2008 | Sugimura |
| 2008/0192441 A1 | 8/2008 | Refai-Ahmed et al. |
| 2008/0212325 A1 | 9/2008 | Wang |
| 2008/0212333 A1 | 9/2008 | Chen |

FOREIGN PATENT DOCUMENTS

WO   WO 2005119633   12/2005

\* cited by examiner

US 7,806,574 B2

THERMAL MANAGEMENT OF LED-BASED LIGHTING SYSTEMS

CROSS-REFERENCE TO RELATED APPLICATIONS

This application claims priority to commonly-owned U.S. Provisional Patent Application No. 60/744,935, filed 16 Apr. 2006 and incorporated herein by reference.

BACKGROUND

Light-emitting diode ("LED") based lighting systems are currently increasing in popularity for a number of reasons. Compared to incandescent lighting (based on filament heating), LED-based lighting systems are much more efficient at conversion of input power to light energy. Compared to fluorescent lighting (based on absorption and reemission of photons generated by a plasma), LED-based lighting systems have longer lifetimes, operate without noticeable flickering and humming, can be dimmed by reducing the operating current thereto, and do not require high voltage electronics.

Efficient removal of heat is important in LED-based lighting systems. Despite its efficiency, heat is generated by an LED during operation, and concentrates in a small volume, potentially increasing the LED's operating temperature significantly. The operating lifetime of an LED is often strongly correlated to its operating temperature, such that a small increase (e.g., a few degrees Celsius) in operating temperature may degrade operating lifetime by hundreds or thousands of hours.

FIG. 1 shows a portion of a prior art LED-based lighting system 10. LEDs 20 and other circuit components 30 mount on a printed circuit board ("PCB") 40, which in turn mounts on a heat sink 60 (not all LEDs 20 and components 30 are labeled in FIG. 1 for clarity of illustration). PCB 40 includes a metal core 45. A front side 42 of metal core PCB 40 has a dielectric layer 50 and conductors 55 that electrically connect LEDs 20 with circuit components 30 and with external power supplies. The metal core of PCB 40 facilitates heat transfer such that heat generated by LEDs 20 flows through PCB 40 (from front side 42 to a back side, hidden in the perspective of FIG. 1) to heat sink 60. System 10 may also include thermal grease (hidden in the perspective of FIG. 1) between the back side of PCB 40 and heat sink 60 to further facilitate heat transfer.

In a thermal test of system 10, with LEDs 20 being ½ watt LEDs and operated at a given test current, a ΔT (difference in temperature) of 5 to 6 degrees Celsius was measured between metal leads of LEDs 20 and heat sink 60.

Another PCB substrate material that has been utilized for LED-based lighting systems is ceramic material, which can be costly and can introduce manufacturing difficulties, such as low yield when substrates are singulated (separated into single units during fabrication) and difficulty in reworking of mounted components.

SUMMARY

An LED-based lighting system includes a printed circuit board ("PCB") having conductors on a front-side thereof, one or more LEDs mounted with the conductors, and a structural element. The PCB is mounted with the conductors near to the structural element so that heat generated by the LEDs dissipates primarily through the conductors and the structural element.

A method of dissipating heat generated by an LED-based lighting system includes configuring a PCB with conductors on a front-side of the PCB, such that when one or more LEDs mounted with the conductors generates heat, the heat dissipates from the one or more LEDs to the conductors. The method also includes integrating a structural element such that at least portions of the conductors face the structural element, and the heat dissipates from the conductors to the structural element.

DETAILED DESCRIPTION OF DRAWINGS

Figure 2:
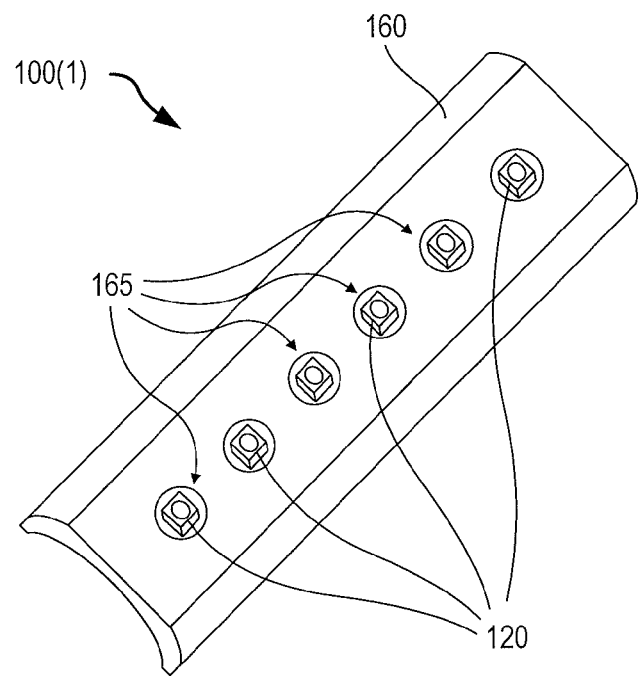
FIG. 2 shows an LED-based lighting system 100 in accord with an embodiment.

FIG. 2 shows an LED-based lighting system 100. System 100 includes a structural element 160 that provides structural support for a PCB (hidden by structural element 160 in the perspective of FIG. 2) on which LEDs 120 are mounted. Structural element 160 may be, for example, a metal rail that readily transfers heat from heat sources to a surrounding environment (e.g., air). Each LED 120 is centered within an aperture 165 formed by structural element 160 so that light emanates from each LED 120 and away from system 100 (not all LEDs 120 and apertures 165 are labeled in FIG. 2 for clarity of illustration). As used herein, the term "LED" includes light-emitting diodes and other devices based thereon, such as for example superluminous diodes and laser diodes.

Figure 3:
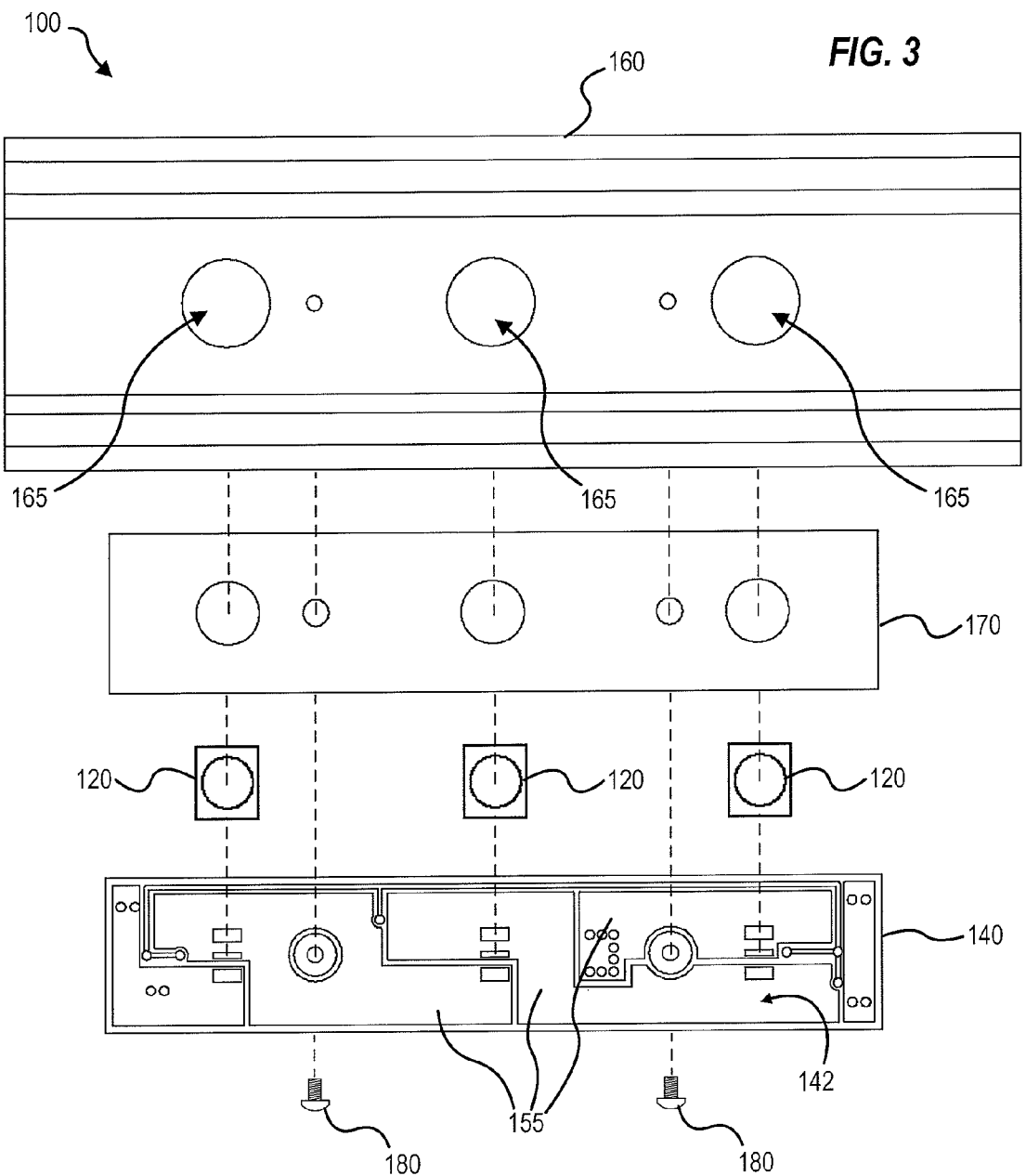
FIG. 3 shows an exploded view of a portion of LED-based lighting system of FIG. 2.

FIG. 3 shows an exploded view of a portion of LED-based lighting system 100. LEDs 120 mount to conductors 155 on a front-side 142 of a PCB 140, which may include a substrate of epoxy glass circuit board material (not all conductors 155 are labeled in FIG. 3 for clarity of illustration). A dielectric film 170 electrically isolates PCB 140 from structural element 160. Dielectric film 170 may optionally be absent if conductors 155 are otherwise isolated from structural element 160, for example when conductors 155 are covered by a solder mask layer (not shown). Alternatively, a structural element 160 formed of aluminum may be anodized to isolate PCB 140 from structural element 160. However, dielectric film 170 may be formed independently of a PCB or rail fabrication process, so that any shorting defects remaining after solder-mask or anodizing processes are insulated by dielectric film 170. Dielectric film 170 may be for example a 4 mil film of Kapton®, although other thicknesses may be utilized, and other dielectrics such as polyester may be utilized. Dielectric film 170 may also be more ductile than a solder mask layer or an anodized layer, so that it conforms to topology of PCB 140 to promote heat transfer between conductors 155 and structural element 160, while ensuring electrical isolation therebetween. In one embodiment, dielectric film 170 covers areas of PCB 140 where a solder mask layer is not present so that components are solderable to through-holes of PCB 140, and so that inclusions or irregularities in conductors 155 that the solder mask does not cover are insulated. Dielectric film 170 and/or a solder mask layer are advantageously thin enough so as not to significantly impede transfer of heat where conductors 155 face structural element 160 (that is, where conductors 155 are immediately adjacent to structural element 160 except for intervening solder mask and/or dielectric layers).

PCB 140 is fastened to structural element 160 using screws 180, or equivalent fasteners such as clips or nuts and bolts. Dashed lines show positions of screws 180 and LEDs 120 with respect to PCB 140 and structural element 160 in the exploded view of FIG. 3.

Conductors 155 are configured such that heat generated by LEDs 120 dissipates first into conductors 155 and then into structural element 160. Conductors 155 are formed of metal (e.g., copper) that may be thicker than required for electrical purposes alone, to facilitate heat transfer away from LEDs 120. For example, standard PCBs may have conductor thicknesses of about 5.5-1.25 oz/ft$^2$ in order to accommodate typical current requirements, but conductors 155 may have conductor thicknesses of about 2.0-2.5 oz/ft$^2$ or more to facilitate this heat dissipation. Also, conductors 155 may be laid out on PCB 140 so as to occupy as much area of PCB 140 as possible. For example, conductors 155 may occupy more than 50%, 70% or even 95% of a surface area of front-side 142 of PCB 140. In the layout shown in FIG. 3, conductors 155 occupy about 74% of the front-side 142 area of PCB 140. Furthermore, the area of conductors 155 may be arranged so as to maximize area of conductors 155 that faces structural element 160 when assembled.

The thickness and large percentage of front side PCB area occupied by conductors 155, and the proximity of conductors 155 to structural element 160, facilitate thermal coupling so that heat generated by LEDs 120 is primarily dissipated through conductors 155 and structural element 160. That is, a majority of heat generated by LEDs 120 dissipates through this heat dissipation path as compared to other paths. When assembled to structural element 160, the large area of conductors 155 is separated from structural element 160 only by thin layers such as soldermask of PCB 140 and optional dielectric layer 170, so that such layers do not significantly impede heat transfer from conductors 155 to structural element 160.

In a thermal test of the configuration shown in FIG. 3, with LEDs 120 being ½ watt LEDs operated at the same test current as used to test system 10 (discussed above), a ΔT between metal leads of LEDs 120 and structural element 160 of 3 to 4 degrees Celsius was measured.

Use of epoxy glass as substrate material for PCB 140 may have certain advantages as compared to the metal core material used in PCB 40 of system 10. Epoxy glass PCBs are inexpensive, and are widely available from a large selection of suppliers, whereas metal core and ceramic PCBs are costly and are available from fewer suppliers. Inner layers can be readily incorporated into epoxy glass PCBs to facilitate electrical or thermal connections, but such layers currently cannot be incorporated into metal core PCBs. Epoxy glass PCBs are readily singulated (that is, separated into single PCBs during fabrication) whereas metal core and ceramic PCBs are more difficult to singulate. Rework of components mounted to epoxy glass PCBs is relatively easy, whereas rework of components mounted to metal core or ceramic PCBs is more difficult. Epoxy glass PCBs are lighter (per unit area) than metal core and ceramic PCBs.

Figure 1:
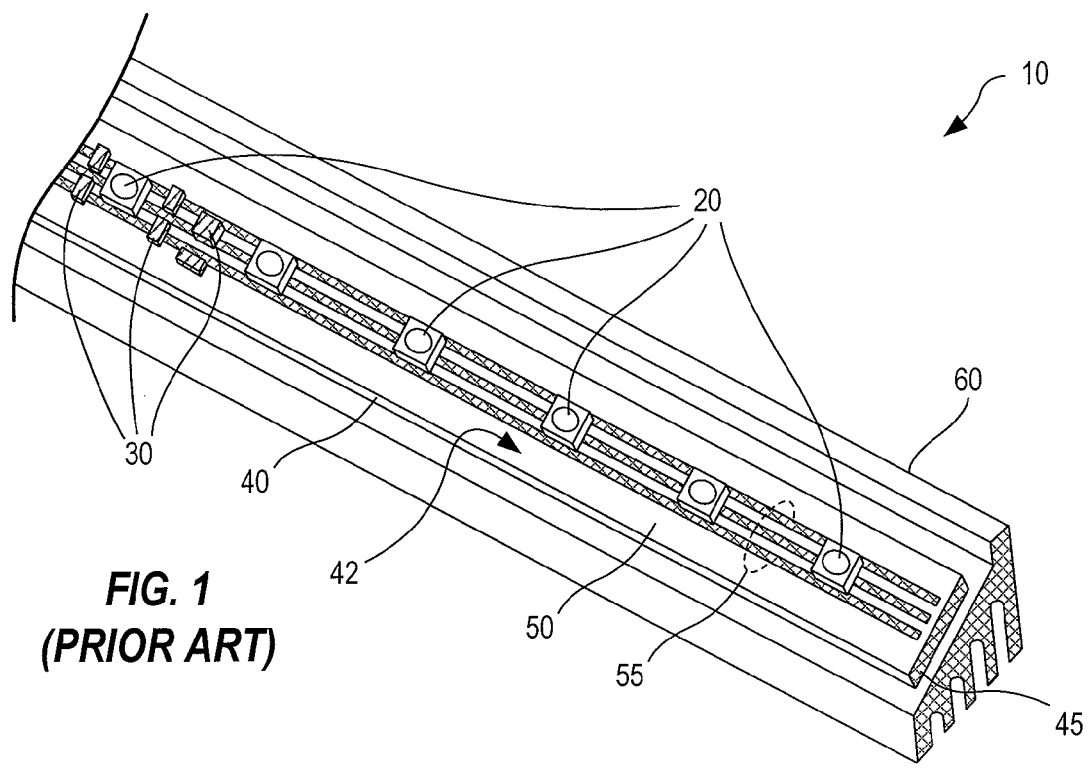
FIG. 1 shows a portion of a prior art LED-based lighting system.

Having LEDs 120 on front-side 142 of PCB 140, while components 130 are on back-side 144 (FIG. 4) may also provide certain advantages. For example, limiting the mounting of components 130 to back-side 144 facilitates a sleek appearance of system 100 wherein LEDs 120 emit light through structural element 160 while components 130 remain hidden from view. By comparison, prior art system 10 (FIG. 1) mounts components 30 along with LEDs 20 on front side 42 of PCB 40, necessitating extra structure if hiding components 30 from view is desired. Also, lack of non-LED components allows front-side 142 to present a planar surface except at LEDs 120; since LEDs 120 fit into apertures 165, the remaining planar surface of front-side 142 readily mounts to an inner surface of structural element 160, facilitating heat transfer. Furthermore, lenses, protective covers or other aesthetic or practical structure may optionally mount to structural element 160 with ease in the vicinity of LEDs 120, since structural element 160 presents an easily used substrate for mounting of such structure. Mounting similar extra structure to system 10 is more difficult since all of conductors 55, LEDs 20 and components 30 compete for space on the same front side 42 of PCB 40.

Figure 4:
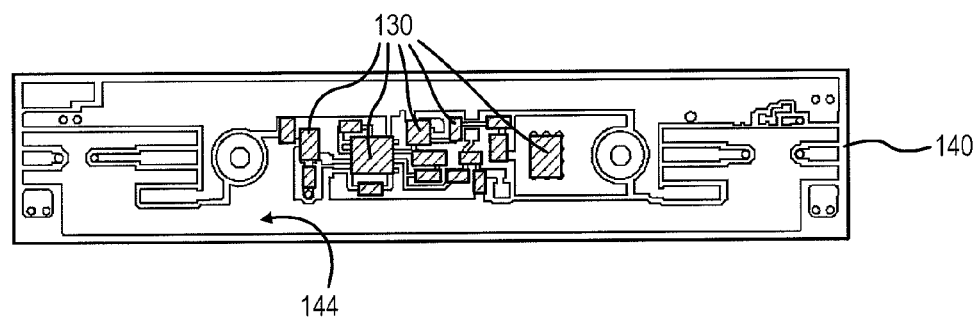
FIG. 4 shows a back side of a PCB of the system of FIG. 3, with components mounted thereto.

FIG. 4 shows a back-side 144 of PCB 140 with components 130 mounted thereto (not all components 130 are labeled in FIG. 4, for clarity of illustration). System 100 (FIG. 3) dissipates more power as heat through LEDs 120 than through components 130, such that thermal management of components 130 is not as critical to reliability of system 100.

Figure 5:
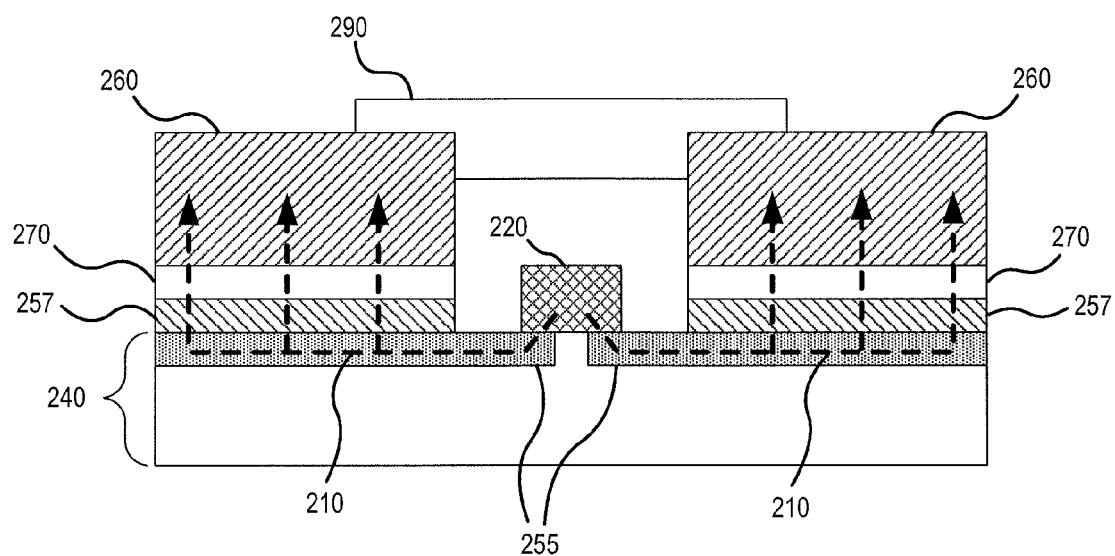
FIG. 5 is a schematic cross-section showing primary heat dissipation for an LED-based lighting system, in accord with an embodiment.

FIG. 5 is a schematic cross-section showing primary heat dissipation paths 210 for an LED-based lighting system 200. System 200 includes a PCB 240 having conductors 255 that are at least partially covered by a solder mask layer 257. A dielectric layer 270 provides additional electrical isolation between PCB 240 and a structural element 260, but does not significantly impede thermal transfer therebetween. An LED 220 emits light that passes through an optional lens 290.

A PCB may include structure for conducting heat from a front side to a back side of the PCB, to further improve heat dissipation from the LEDs. For example, the PCB may include vias filled with metal to facilitate heat transfer from a front-side to a back-side of the PCB, as now discussed in FIG. 6.

Figure 6:
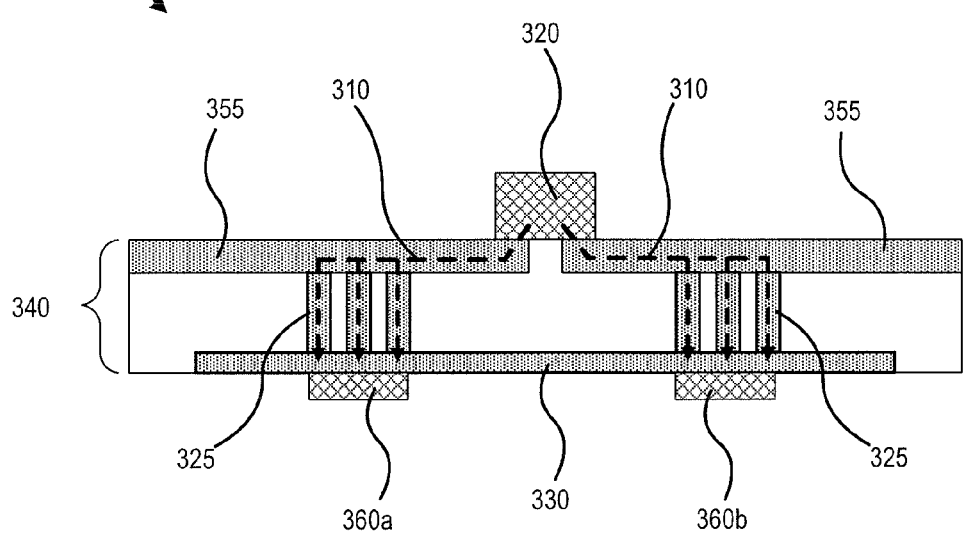
FIG. 6 is a schematic cross-section showing primary heat dissipation for another LED-based lighting system, in accord with an embodiment.

FIG. 6 is a schematic cross-section showing primary heat dissipation paths 310 for an LED-based lighting system 300. System 300 includes a PCB 340 having conductors 355. An LED 320 emits light and generates heat that passes into conductors 355. Metal-filled vias 325 facilitate heat transfer from conductors 355 to back-side conductors 330 (not all vias 325 are labeled in FIG. 6 for clarity of illustration). Metal-filled vias 325 may be formed at the time of PCB fabrication—for example, as vias that are through-hole plated—or may be formed after fabrication—for example, by filling holes of PCB 340 with solder, or mechanically by inserting or screwing metal rods or screws through PCB 340. Back-side conductors 330 may dissipate heat into a surrounding medium (e.g., air) directly. Alternatively, conductors 330 may facilitate heat transfer to optional heat sinks 360$a$ and 360$b$, which may include passive structures (e.g., radiating structures) and/or active devices (e.g., fans). In FIG. 6, optional heat sink 360$a$ is a passive device and optional heat sink 360$b$ is an active device.

The above description of thermal dissipation paths for LED-based lighting systems thus provide methods for generating thermal dissipation paths. Such methods include specifying PCB conductors that are thicker than required to supply current to the LEDs and that occupy 50% or more of PCB area, and configuring the conductors in close proximity to structural elements so as to dissipate heat away from the LEDs.

Changes may be made in thermal management of the LED-based lighting systems described herein without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An LED (light-emitting diode)-based lighting system, comprising:
    a PCB (printed circuit board) having conductors on a front-side thereof, the conductors occupying at least 50% of a front-side area of the PCB;
    one or more LEDs mounted with the conductors; and
    a structural element comprising a metal rail that forms a corresponding aperture in one to one relationship with each of the one or more LEDs, such that each of the one or more LEDs is centered within its corresponding aperture;
    the PCB being mounted with the conductors proximate to the structural element so that heat generated by the one or more LEDs primarily dissipates through the conductors and the structural element.

2. The lighting system of claim 1, wherein the PCB comprises an epoxy glass substrate.

3. The lighting system of claim 1, further comprising a dielectric film between the PCB and the structural element.

4. The lighting system of claim 1, wherein the conductors occupy at least 70% of the front-side area of the PCB.

5. The lighting system of claim 1, wherein any components mounted on the front-side of the PCB consist of the one or more LEDs.

6. The lighting system of claim 1, the conductors being first conductors, and further comprising one or more metal-filled vias from the first conductors to second conductors on a back-side of the PCB.

7. The lighting system of claim 6, further comprising one or more heat sinks in thermal communication with the second conductors.

8. The lighting system of claim 7, the one or more heat sinks comprising one or more of passive structures and active devices.

9. A method of dissipating heat generated by an LED (light-emitting diode)-based lighting system, comprising:
    configuring a PCB (printed circuit board) with one or more conductors on a front-side thereof, with the conductors occupying at least 50% of a front-side area of the PCB, such that when one or more LEDs mounted to the conductors generates heat, the heat dissipates from the one or more LEDs to the conductors, and
    integrating the PCB to a structural element comprising a metal rail that forms a corresponding aperture in one to one relationship with each of the one or more LEDs, such that each of the one or more LEDs is centered within its corresponding aperture, such that at least portions of the one or more conductors face the structural element, and a majority of the heat dissipates from the conductors to the structural element.

10. Method of claim 9, wherein the step of configuring includes specifying the conductors to have a thickness greater than required to supply current to the one or more LEDs.

11. Method of claim 9, wherein the step of configuring includes specifying the PCB to include an epoxy glass substrate.

12. Method of claim 9, wherein the steps of configuring and integrating include maximizing area of the conductors that face the structural element.

13. Method of claim 9, wherein the steps of configuring and integrating include configuring the PCB such that the LEDs mount on the front-side and any other components mount on a back-side of the PCB.

* * * * *